(12) United States Patent
Yamamura

(10) Patent No.: US 9,814,138 B2
(45) Date of Patent: Nov. 7, 2017

(54) WIRING SUBSTRATE

(71) Applicant: SHINKO ELECTRIC INDUSTRIES CO., LTD., Nagano-shi, Nagano-ken (JP)

(72) Inventor: Kyota Yamamura, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/355,757

(22) Filed: Nov. 18, 2016

(65) Prior Publication Data

US 2017/0150603 A1 May 25, 2017

(30) Foreign Application Priority Data

Nov. 25, 2015 (JP) ................. 2015-229511

(51) Int. Cl.
| | |
|---|---|
| *H05K 1/11* | (2006.01) |
| *H05K 1/09* | (2006.01) |
| *H05K 1/03* | (2006.01) |
| *H05K 3/42* | (2006.01) |
| *H05K 3/06* | (2006.01) |
| *H05K 3/22* | (2006.01) |

(52) U.S. Cl.
CPC ............. *H05K 1/115* (2013.01); *H05K 1/09* (2013.01); *H05K 3/06* (2013.01); *H05K 3/061* (2013.01); *H05K 3/227* (2013.01); *H05K 3/423* (2013.01)

(58) Field of Classification Search
CPC ..................................................... H05K 1/115
USPC ................. 174/251, 255, 256, 257, 262
See application file for complete search history.

(56) References Cited

U.S. PATENT DOCUMENTS

| | | | | |
|---|---|---|---|---|
| 2014/0060902 | A1* | 3/2014 | Hu ...................... | H05K 1/0296 174/257 |
| 2014/0083745 | A1* | 3/2014 | Shimizu ................ | H05K 3/389 174/251 |
| 2014/0151095 | A1* | 6/2014 | Cho ..................... | H05K 1/0306 174/255 |
| 2016/0037629 | A1* | 2/2016 | Takahashi ......... | H01L 23/49866 174/257 |

FOREIGN PATENT DOCUMENTS

JP 2001-291954 A 10/2001

* cited by examiner

*Primary Examiner* — Sherman Ng
(74) *Attorney, Agent, or Firm* — Tarolli, Sundheim, Covell & Tummino LLP

(57) ABSTRACT

A wiring substrate includes a first insulation layer covering a first wiring layer, a wiring pattern formed on an upper surface of the first insulation layer, and a via formed in a via hole of the first insulation layer to electrically connect the wiring pattern and the first wiring layer. The via includes a via seed layer and a filled portion filling the via hole. The wiring pattern includes a wiring seed layer formed on the upper surface of the first insulation layer and a pattern layer formed on the wiring seed layer. The via seed layer is formed from a metal acting to adsorb a plating enhancement agent, which enhances formation of the filled portion and the pattern layer in an electrolytic plating solution. The wiring seed layer is formed from a metal not acting to adsorb the plating enhancement agent as compared to the via seed layer.

3 Claims, 5 Drawing Sheets

WIRING SUBSTRATE

CROSS-REFERENCE TO RELATED APPLICATIONS

This application is based upon and claims the benefit of priority from prior Japanese Patent Application No. 2015-229511, filed on Nov. 25, 2015, the entire contents of which are incorporated herein by reference.

FIELD

This disclosure relates to a wiring substrate and a method for manufacturing a wiring substrate.

BACKGROUND

A wiring substrate includes insulation layers and wiring layers. The wiring layers are electrically connected to one another by vias that extend through the insulation layers. For example, a build-up process is performed to manufacture such a wiring substrate by alternately forming insulation layers and wiring layers one upon another. Each insulation layer includes via holes. The via holes are filled with a plating metal such as copper to form vias. Japanese Laid-Open Patent Publication No. 2001-291954 discloses a prior art wiring substrate.

In a wiring substrate, wiring patterns (wiring layers) have become finer. This has reduced the thickness of the wiring layers. Thus, when filling the via holes with copper, the amount of copper filling the via holes may be insufficient. In such a case, the insufficient amount of copper may lead to defective connection between the vias and the wiring layers.

SUMMARY

One embodiment of a wiring substrate includes a first wiring layer, a first insulation layer that covers the first wiring layer, and a second wiring layer that includes a wiring pattern and a via. The first insulation layer includes a via hole that exposes a portion of an upper surface of the first wiring layer. The wiring pattern is formed on an upper surface of the first insulation layer. The via is formed in the via hole to electrically connect the wiring pattern and the first wiring layer. The via includes a via seed layer and a filled portion. The via seed layer is formed on a wall surface of the first insulation layer that defines the via hole. The filled portion is formed in the via hole in which the via seed layer is formed. The via hole is filled with the filled portion. The wiring pattern includes a wiring seed layer, which is formed on the upper surface of the first insulation layer, and a pattern layer, which is formed on the wiring seed layer. The via seed layer is formed from a metal material that acts to adsorb a plating enhancement agent, which enhances formation of the filled portion and the pattern layer in an electrolytic plating solution. The wiring seed layer is formed from a metal material that does not act to adsorb the plating enhancement agent as compared to the via seed layer.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
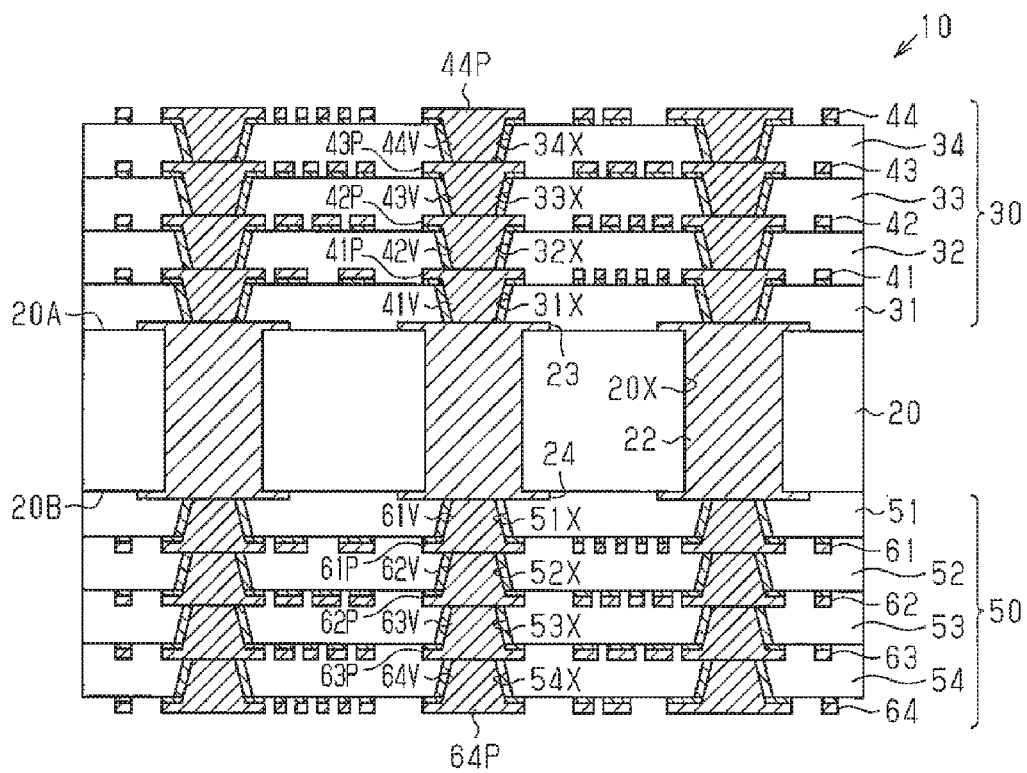
FIG. 1A is a schematic cross-sectional view of a wiring substrate.

One embodiment will now be described with reference to the accompanying drawings. Elements in the drawings may be partially enlarged for simplicity and clarity and thus have not necessarily been drawn to scale. To facilitate understanding, hatching lines may not be shown in the cross-sectional drawings.

As illustrated in FIG. 1A, a wiring substrate 10 includes a core substrate 20, a wiring portion 30, which is formed on an upper surface 20A of the core substrate 20, and a wiring portion 50, which is formed on a lower surface 20B of the core substrate 20. The core substrate 20 may be a glass-epoxy substrate obtained by impregnating a glass cloth (glass woven cloth), which is a reinforcement material, with a thermosetting insulative resin, which contains an epoxy resin as the main component, and curing the resin.

Through holes 20X extend through the core substrate 20 from the upper surface 20A to the lower surface 20B at given locations. Through electrodes 22 are formed in the through holes 20X. The material of the through electrodes 22 is, for example, copper (Cu) or a copper alloy.

A wiring layer 23 is formed on the upper surface 20A of the core substrate 20. A wiring layer 24 is formed on the lower surface 20B of the core substrate 20. The wiring layers 23, 24 are electrically connected to each other by the through electrodes 22. The material of the wiring layers 23, 24 is, for example, copper or a copper alloy.

The wiring portion 30 includes a plurality of (in FIG. 1A, four) insulation layers 31 to 34 and a plurality of (in FIG. 1A, four) wiring layers 41 to 44. The insulation layers 31 to 34 and the wiring layers 41 to 44 are alternately formed upward on the upper surface 20A of the core substrate 20. Via holes 31X to 34X extend through the insulation layers 31 to 34, respectively.

The wiring layers 41 to 44 include vias 41V to 44V, which are respectively formed in the via holes 31X to 34X, and wiring patterns 41P to 44P, which are respectively formed on upper surfaces of the insulation layers 31 to 34. Each of the vias 41V to 44V electrically connects the wiring layer that is formed on the upper surface of the corresponding insulation layer and the wiring layer that is formed on the lower surface of the insulation layer. For example, the vias 41V, which are formed in the via holes 31X of the insulation layer 31, electrically connect the wiring layer (in present example, wiring pattern 41P) that is formed on the upper surface of the insulation layer 31 and the wiring layer 23, which is formed on the lower surface of the insulation layer 31. The remaining vias 42V to 44V, which are formed in the via holes 32X to 34X of the insulation layers 32 to 34, are configured in the same manner.

The wiring portion 50 includes a plurality of (in FIG. 1A, four) insulation layers 51 to 54 and a plurality of (in FIG.

1A, four) wiring layers 61 to 64. The insulation layers 51 to 54 and the wiring layers 61 to 64 are alternately formed downward on the lower surface 20B of the core substrate 20. Via holes 51X to 54X extend through the insulation layers 51 to 54, respectively.

The wiring layers 61 to 64 include vias 61V to 64V, which are respectively formed in the via holes 51X to 54X, and wiring patterns 61P to 64P, which are respectively formed on lower surfaces of the insulation layers 51 to 54. In the same manner as the wiring portion 30, each of the vias 61V to 64V electrically connects the wiring layer that is formed on the lower surface of the corresponding insulation layer and the wiring layer that is formed on the upper surface of the insulation layer.

Figure 1B:
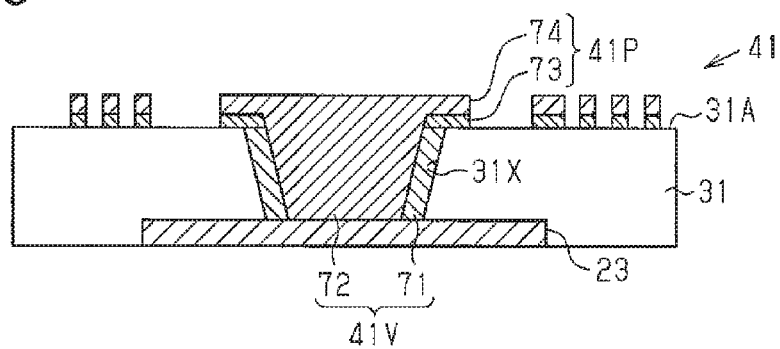
FIG. 1B is a partially enlarged cross-sectional view of the wiring substrate illustrated in FIG. 1A.

As illustrated in FIG. 1B, the via 41V includes a via seed layer 71 and a filled portion 72. The via seed layer 71 is formed on a wall surface of the insulation layer 31 that defines the via hole 31X. The via seed layer 71 is formed, for example, through electroless plating. When electroless plating is performed to form the via seed layer 71 in the via hole 31X, the via seed layer 71 is also formed on the upper surface of the wiring layer 23 that is exposed by the via hole 31X. FIGS. 1A and 1B illustrate the enlarged via seed layer 71, which is formed in the via holes 31X of the insulation layer 31, and do not illustrate the via seed layer 71 formed on the upper surface of the wiring layer 23. Hereafter, the via seed layer 71 is formed on the wall surfaces of the insulation layer 31 defining the via holes 31X and the upper surface of the wiring layer 23 unless otherwise specified in the description.

The filled portion 72 is formed in the via hole 31X in which the via seed layer 71 is formed. The filled portion 72 is rod-shaped. In the present example, the filled portion 72 is shaped as an inverted truncated cone and has a diameter that decreases toward the core substrate 20. The material of the via seed layer 71 is, for example, copper or a copper alloy. Subsequent to the formation of the via seed layer 71 in the via hole 31X, the via hole 31X is filled with the filled portion 72. The filled portion 72 is, for example, copper or a copper alloy. The filled portion 72 is formed, for example, through electrolytic plating.

The wiring pattern 41P includes a wiring seed layer 73 and a pattern layer 74. The wiring seed layer 73 is formed on an upper surface 31A of the insulation layer 31. The pattern layer 74 covers an upper surface of the wiring seed layer 73 and an upper surface of the via 41V. The material of the wiring seed layer 73 is, for example, nickel (Ni) or a nickel alloy. The material of the pattern layer 74 is, for example, copper or a copper alloy. The wiring seed layer 73 is formed, for example, through electroless plating or sputtering or by applying a paste. The pattern layer 74 is formed, for example, through electrolytic plating.

In the present example, the pattern layer 74 of the wiring pattern 41P and the filled portion 72 of the via 41V have the same material. Additionally, the pattern layer 74 and the filled portion 72 are formed at the same step in the same process.

In the present example, the pattern layer 74 and the filled portion 72 are formed through electrolytic plating using the wiring seed layer 73 and the via seed layer 71 as power feeding layers (power feeding electrodes). The materials of the wiring seed layer 73 and the via seed layer 71 are selected based on properties (characteristics) that are necessary in the step of forming the pattern layer 74 and the filled portion 72.

In the present example, the pattern layer 74 and the filled portion 72 are each an electrolytic plating film formed from, for example, copper or a copper alloy. In the present example, when electrolytic plating is performed using the wiring seed layer 73 and the via seed layer 71 as the power feeding layers, a plating enhancement agent is used. For example, bis(3-sulfopropyl)disulfide is used as the plating enhancement agent.

Alternatively, the plating enhancement agent may be, for example, bis(2-sulfopropyl)disulfide and its sodium salt; bis(4-sulfopropyl)disulfide and its sodium salt; bis(3-sulfo-2-hydroxypropyl)disulfide and its sodium salt; N,N-dimethyldithiocarbamate(-3-sulfopropylester) and its sodium salt; O-ethyl-diethylcarbonate-S(-3-sulfopropylester); or thiourea and its derivative.

The plating enhancement agent enhances deposition of a metal contained in an electrolytic plating solution. The plating enhancement agent is adsorbed in different manners by different kinds of metals. For example, copper acts to adsorb the plating enhancement agent of bis(3-sulfopropyl)disulfide, whereas nickel does not produce such an adsorption effect. Thus, the plating enhancement agent is adsorbed on the surface of the via seed layer 71, which is formed from copper or a copper alloy, but not on the surface of the wiring seed layer 73, which is formed from nickel or a nickel alloy. Therefore, the via seed layer 71 is formed in the via hole 31X from a metal material that acts to adsorb the plating enhancement agent. The wiring seed layer 73 is formed on the upper surface 31A of the insulation layer 31 from a metal material that does not or subtly act to adsorb the plating enhancement agent as compared to the via seed layer 71.

The adsorption action of the plating enhancement agent affected by nickel or copper may be determined by, for example, electrochemistry measurement. When preparing a nickel piece and a copper piece that are immersed in a solution containing the plating enhancement agent and a nickel piece and a copper piece that are not immersed in the solution, the metal pieces undergo electrolytic plating, for example, using an electrolytic copper plating solution that does not contain the plating enhancement agent. Subsequent to the electrolytic plating, the electric potential of each metal piece is measured. This obtains no difference in the electric potential between the nickel piece immersed in the solution containing the plating enhancement agent and the non-immersed nickel piece. However, the copper piece immersed in the solution containing the plating enhancement agent and the non-immersed copper piece have different electric potentials.

Thus, in electrolytic plating, the plating enhancement effect acts on the surface of the via seed layer 71, on which the plating enhancement agent is adsorbed in the via hole 31X. This enhances formation of an electrolytic plate (in present example, copper plate) on the surface of the via seed layer 71, which is formed in the via hole 31X, as compared to the surface of the wiring seed layer 73. In this situation, electrolytic plates are formed on the copper surface deposited in the via hole 31X (on surface of via seed layer 71) and the surface of the wiring seed layer 73, which is formed from nickel or a nickel alloy. As a result, the via hole 31X is filled with the electrolytic plate (copper plate) to form the filled portion 72. Further, the electrolytic plate (copper plate) covers the filled portion 72 and the wiring seed layer 73 to form the pattern layer 74.

The vias 42V to 44V and 61V to 64V, which are illustrated in FIG. 1A, are formed in the same manner as the via 41V, which has been described with reference to FIG. 1B. Also, the wiring patterns 42P to 44P and 61P to 64P are formed in the same manner as the wiring pattern 41P. Thus, the vias 42V to 44V and 61V to 64V and the wiring patterns 42P to 44P and 61P to 64P will not be described in detail.

A method for manufacturing the wiring substrate 10 will now be described. A method for forming the wiring seed layer 73 and the via seed layer 71, which are illustrated in FIG. 1B, will be described first.

Figure 2A:
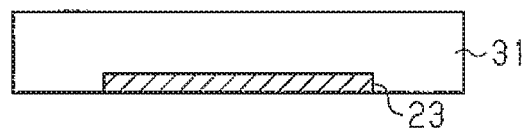
FIGS. 2A to 2G, 3A to 3E, 4A to 4F, and 5A to 5E are schematic cross-sectional views of a method for manufacturing the wiring substrate illustrated in FIG. 1A.

As illustrated in FIG. 2A, the wiring layer 23 is covered by the insulation layer 31. The insulation layer 31 is formed, for example, by covering the wiring layer 23 with a film resin and then curing the film resin by applying heat and pressure.

Figure 2B:
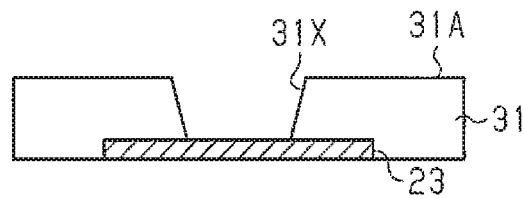

As illustrated in FIG. 2B, the via hole 31X is formed at a given location of the insulation layer 31 to expose a portion of the upper surface of the wiring layer 23. The via hole 31X is formed, for example, through laser cutting. When the insulation layer 31 is formed from a photosensitive resin, for example, photolithography may be performed to form the via hole 31X. When laser cutting is performed to form the via hole 31X, a desmear process is performed to remove smears (resin smears) from the via hole 31X.

Figure 2C:
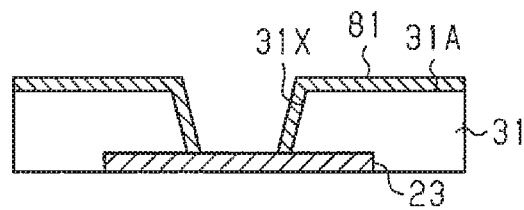

As illustrated in FIG. 2C, a metal film 81 is formed to cover the upper surface 31A of the insulation layer 31 and the wall surfaces of the insulation layer 31 defining the via hole 31X. The metal film 81 is, for example, a copper film formed through electroless plating.

Figure 2D:
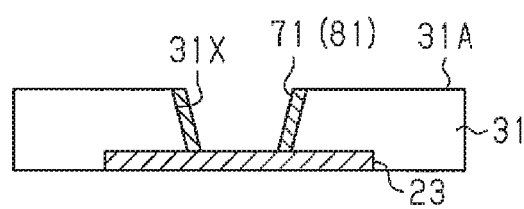

As illustrated in FIG. 2D, the metal film 81 (refer to FIG. 2C) is removed from the upper surface 31A of the insulation layer 31. The metal film 81 is removed, for example, through a drying process such as air blowing and soft etching. First, the insulation layer 31 (wiring substrate) on which the metal film 81 is formed is sufficiently dried. Then, the dried wiring substrate is immersed in an etchant to undergo soft etching. The wiring substrate is dried to lower the wettability of the metal film 81. This hinders the etchant from entering the metal film 81, which is formed in the via hole 31X. Soft etching removes the metal film 81 only from the upper surface 31A of the insulation layer 31. Consequently, as illustrated in FIG. 2D, the upper surface 31A of the insulation layer 31 is exposed, and the metal film 81 remains only in the via hole 31X as the via seed layer 71.

Figure 2E:
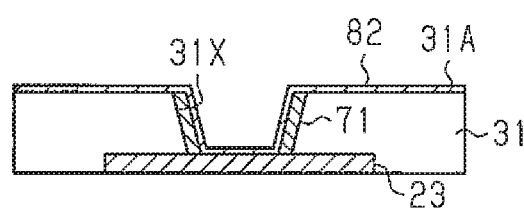

As illustrated in FIG. 2E, a catalyst 82 is adsorbed on the upper surface 31A of the insulation layer 31 and the surface of the via seed layer 71, which is formed in the via hole 31X. In the present example, a palladium catalyst is used as the catalyst 82.

Figure 2F:
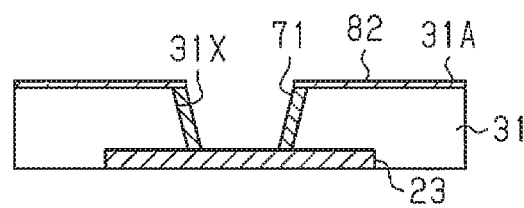

As illustrated in FIG. 2F, the catalyst 82 (refer to FIG. 2E) is removed from the via hole 31X. The catalyst 82 is removed, for example, through soft etching with an etchant selected in accordance with the material of the via seed layer 71. In the present example, a copper etchant is used to slightly etch the surface of the via seed layer 71. This removes the catalyst 82 from the via hole 31X. As a result, the catalyst 82 remains only on the upper surface 31A of the insulation layer 31.

Figure 2G:
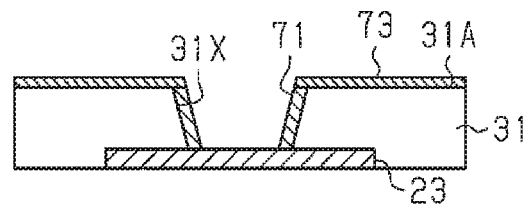

As illustrated in FIG. 2G, the wiring seed layer 73 is formed on the upper surface 31A of the insulation layer 31. The wiring seed layer 73 is formed from, for example, nickel. For example, an electroless nickel plating solution is used to form the wiring seed layer 73. In this step, the wiring seed layer 73 is not in the desired shape and covers the entire upper surface 31A of the insulation layer 31.

The above steps form the copper via seed layer 71, which covers the wall surface defining the via hole 31X, and the nickel wiring seed layer 73, which covers the upper surface 31A of the insulation layer 31.

Steps of forming the filled portion 72 and the pattern layer 74 will now be described. As illustrated in FIG. 2G, subsequent to the formation of the via seed layer 71 and the wiring seed layer 73, for example, a semi-additive process is performed to form the wiring pattern 41P illustrated in FIG. 1B.

Figure 3A:
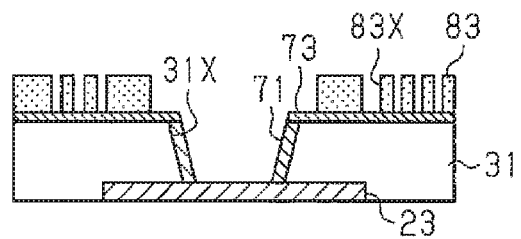

As illustrated in FIG. 3A, a resist layer 83, which includes openings 83X at given locations, is formed on the wiring seed layer 73. The openings 83X expose portions of the wiring seed layer 73 corresponding to the wiring pattern 41P illustrated in FIG. 1B. The material of the resist layer 83 may have resistance to plating. For example, a photosensitive dry film resist or a liquid photoresist may be used as the resist layer 83. Such a resist material may be, for example, a novolac resin or an acrylic resin. For example, when a photosensitive dry film resist is used, the upper surface of the wiring seed layer 73 is laminated with a dry film through thermocompression bonding. The dry film is patterned through photolithography to form the resist layer 83 that includes the openings 83X. When a liquid photoresist is used, the same steps may form the resist layer 83.

Figure 3B:
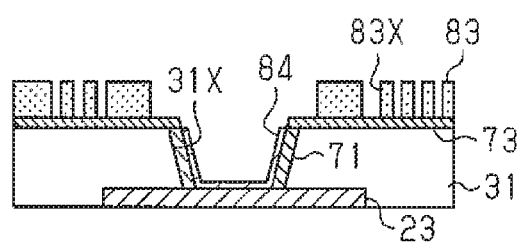

As illustrated in FIG. 3B, a plating enhancement agent 84 is adsorbed on the surface of the via seed layer 71, which is formed in the via hole 31X. The plating enhancement agent 84 is, for example, bis(3-sulfopropyl)disulfide. First, a pre-dipping process is performed in which the wiring substrate (structure illustrated in FIG. 3B) is immersed in a solution containing the plating enhancement agent. In the pre-dipping process, the plating enhancement agent 84 is adsorbed on the copper via seed layer 71.

The nickel wiring seed layer 73 produces an adsorption effect acting on the plating enhancement agent 84 that is much smaller than that produced by the copper via seed layer 71. This inhibits adsorption of the plating enhancement agent 84 on the wiring seed layer 73 by adjusting the pre-dipping time or the weight concentration of the plating enhancement agent 84.

Figure 3C:
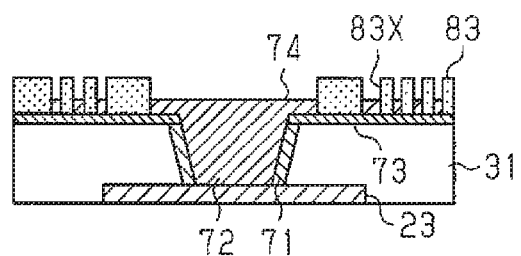

As illustrated in FIG. 3C, electrolytic plating is performed to form the filled portion 72 and the pattern layer 74 using the resist layer 83 as a plating mask and the wiring seed layer 73 and the via seed layer 71 as power feeding electrodes. The plating enhancement agent 84, which is illustrated in FIG. 3B, enhances deposition of copper on the surface of the via seed layer 71 from the electrolytic plating solution. The electrolytic plating solution does not contain the plating enhancement agent. As a result, the via hole 31X, in which the via seed layer 71 is formed, is filled with a plating metal (copper) to form the filled portion 72. Further, the plating metal (copper) deposits on the upper surface of the filled portion 72 and the upper surface of the wiring seed layer 73 to form the pattern layer 74.

Figure 3D:
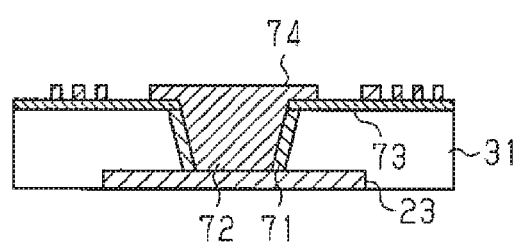

As illustrated in FIG. 3D, the resist layer 83 is removed to expose portions of the upper surface of the wiring seed layer 73.

Figure 3E:
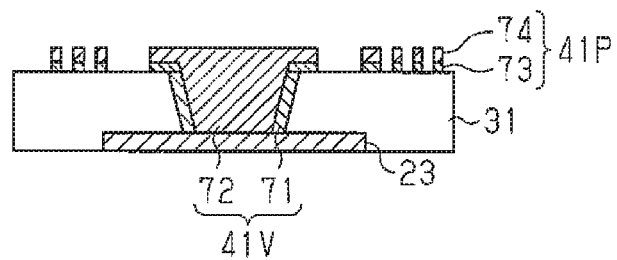

As illustrated in FIG. 3E, for example, flash etching is performed using the pattern layer 74 as an etching mask to remove the wiring seed layer 73 that is exposed from the pattern layer 74. This obtains the wiring pattern 41P, which is formed by the wiring seed layer 73 and the pattern layer 74 and has the desired shape.

Another method for forming the filled portion 72 and the pattern layer 74 will now be described with reference to FIGS. 4A to 4F. In this formation process, subsequent to the formation of the via seed layer 71 and the wiring seed layer 73, which are illustrated in FIG. 2G, for example, a subtractive process is performed to form the wiring pattern 41P illustrated in FIG. 1B.

Figure 4A:
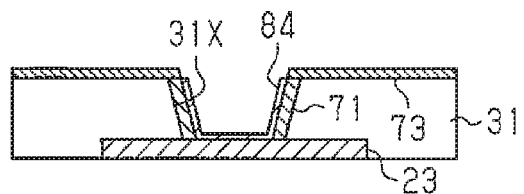

As illustrated in FIG. 4A, the plating enhancement agent 84 is adsorbed on the surface of the via seed layer 71, which is formed in the via hole 31X. The plating enhancement agent 84 is, for example, bis(3-sulfopropyl)disulfide. First, the pre-dipping process is performed in which the wiring substrate (structure illustrated in FIG. 4A) is immersed in the solution containing the plating enhancement agent. In the pre-dipping process, the plating enhancement agent 84 is adsorbed on the copper via seed layer 71.

The nickel wiring seed layer 73 produces an adsorption effect acting on the plating enhancement agent 84 that is much smaller than that produced by the copper via seed layer 71. This inhibits adsorption of the plating enhancement agent 84 on the wiring seed layer 73 by adjusting the pre-dipping time or the weight concentration of the plating enhancement agent 84.

Figure 4B:
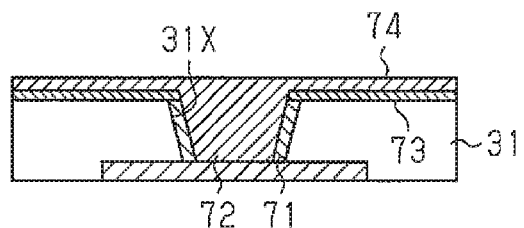

As illustrated in FIG. 4B, electrolytic plating is performed using the wiring seed layer 73 and the via seed layer 71 as power feeding electrodes to form the filled portion 72 and the pattern layer 74. In this step, the pattern layer 74 is not in the desired shape and covers the entire upper surface 31A of the insulation layer 31. The plating enhancement agent 84, which is illustrated in FIG. 4A, enhances deposition of copper on the surface of the via seed layer 71 from the electrolytic plating solution. The electrolytic plating solution does not contain the plating enhancement agent. As a result, the via hole 31X, in which the via seed layer 71 is formed, is filled with a plating metal (copper) to form the filled portion 72. Further, the plating metal (copper) deposits on the upper surface of the filled portion 72 and the upper surface of the wiring seed layer 73 to form the pattern layer 74.

Figure 4C:
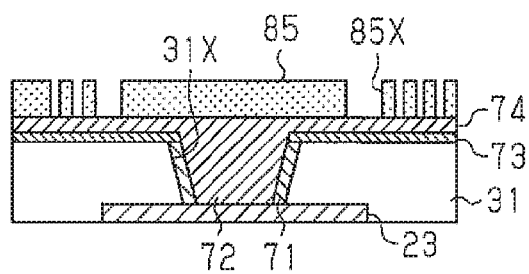

As illustrated in FIG. 4C, a resist layer 85, which includes openings 85X at given locations, is formed on the pattern layer 74. The openings 85X expose portions of the pattern layer 74 corresponding to the wiring pattern 41P illustrated in FIG. 1B. The material of the resist layer 85 may have resistance to etching. For example, a photosensitive dry film resist or a liquid photoresist may be used as the resist layer 85. Such a resist material may be, for example, a novolac resin or an acrylic resin. For example, when a photosensitive dry film resist is used, the upper surface of the pattern layer 74 is laminated with a dry film through thermocompression bonding. The dry film is patterned through photolithography to form the resist layer 85 that includes the openings 85X. When a liquid photoresist is used, the same steps may form the resist layer 85.

Figure 4D:
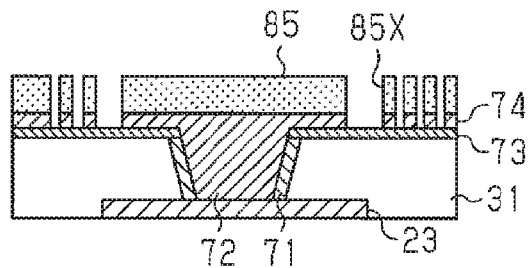

As illustrated in FIG. 4D, when the resist layer 85 is used as an etching mask, the pattern layer 74 illustrated in FIG. 4C is etched into the desired shape.

Figure 4E:
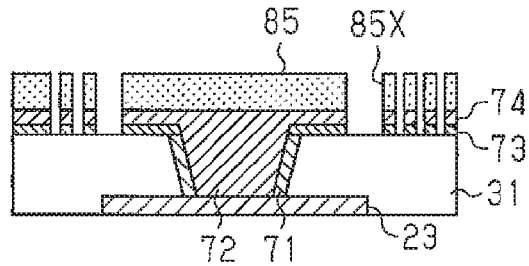
Figure 4F:
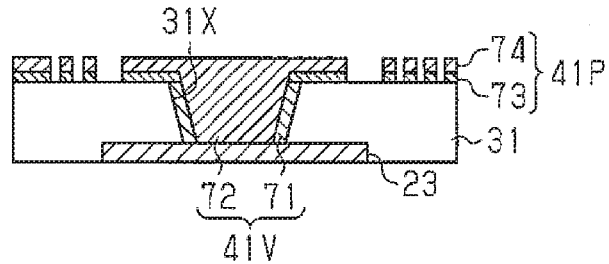

As illustrated in FIG. 4E, when the resist layer 85 is used as an etching mask, the wiring seed layer 73 illustrated in FIG. 4D is etched into the desired shape. As illustrated in FIG. 4F, the resist layer 85 is removed.

Another method for forming the via seed layer 71 and the wiring seed layer 73 will now be described with reference to FIGS. 5A to 5E.

Figure 5A:
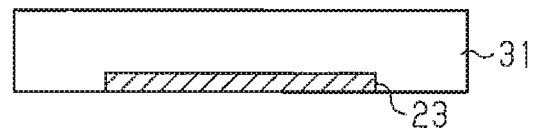

As illustrated in FIG. 5A, the wiring layer 23 is covered by the insulation layer 31. The insulation layer 31 is formed, for example, by covering the wiring layer 23 with a film resin and then curing the film resin by applying heat and pressure.

Figure 5B:
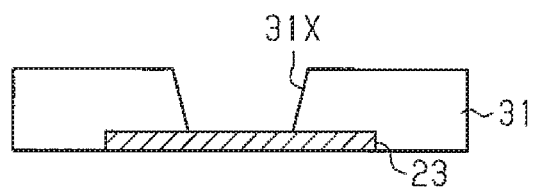

As illustrated in FIG. 5B, the via hole 31X is formed at a given location of the insulation layer 31 to expose a portion of the upper surface of the wiring layer 23. The via hole 31X is formed, for example, through laser cutting. When the insulation layer 31 is formed from a photosensitive resin, for example, photolithography may be performed to form the via hole 31X. When laser cutting is performed to form the via hole 31X, a desmear process is performed to remove smears (resin smears) from the via hole 31X.

Figure 5C:
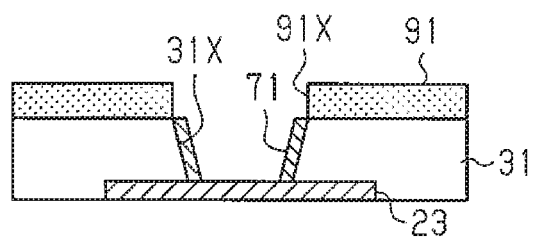

As illustrated in FIG. 5C, a resist layer 91, which includes an opening 91X corresponding to the via hole 31X, is formed. The resist layer 91 covers the upper surface 31A of the insulation layer 31. For example, electroless plating is performed using the resist layer 91 as a plating mask to form the via seed layer 71 in the via hole 31X. The material of the resist layer 91 may have resistance to plating. For example, a photosensitive dry film resist or a liquid photoresist may be used as the resist layer 91. Such a resist material may be, for example, a novolac resin or an acrylic resin. For example, when a photosensitive dry film resist is used, the upper surface of the wiring seed layer 73 and the surface of the via seed layer 71, which is formed in the via hole 31X, are laminated with a dry film through thermocompression bonding. The dry film is patterned through photolithography to form the resist layer 91. When a liquid photoresist is used, the same steps may form the resist layer 91.

Figure 5D:
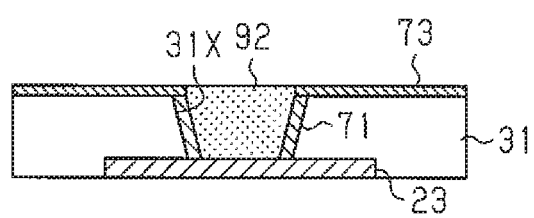

As illustrated in FIG. 5D, the via hole 31X is masked. For example, a resist layer 92 is formed in the via hole 31X. The material of the resist layer 92 may be a photosensitive dry film resist or a liquid photo resist. Such a resist material may be, for example, a novolac resin or an acrylic resin. For example, when a photosensitive dry film resist is used, the upper surface of the insulation layer 31 and the surface of the via seed layer 71, which is formed in the via hole 31X, are laminated with a dry film through thermocompression bonding. The dry film is patterned through photolithography to form the resist layer 92. When a liquid photoresist is used, the same steps may form the resist layer 92.

Then, a semi-cured conductive paste containing nickel is applied to the upper surface 31A of the insulation layer 31, for example, through screen printing to form the wiring seed layer 73.

Figure 5E:
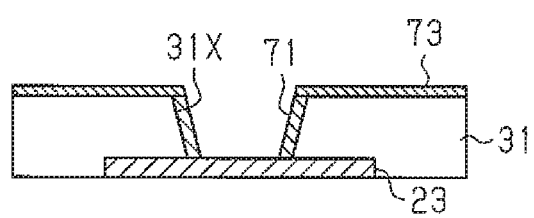

As illustrated in FIG. 5E, the resist layer 92 is removed from the via hole 31X by an alkaline chemical solution or alcohol that is selected in accordance with the material of the resist layer. This obtains a structural body that includes the copper via seed layer 71, which covers the wall surface of the insulation layer 31 defining the via hole 31X, and the nickel wiring seed layer 73, which covers the upper surface 31A of the insulation layer 31.

The present embodiment has the advantages described below.

(1) The wiring portion 30 includes the insulation layers 31 to 34 and the wiring layers 41 to 44. The insulation layers 31 to 34 and the wiring layers 41 to 44 are alternately formed one upon another. The via holes 31X to 34X respectively extend through the insulation layers 31 to 34. The wiring layers 41 to 44 include the vias 41V to 44V, which are respectively formed in the via holes 31X to 34X, and the wiring patterns 41P to 44P, which are respectively formed on the upper surfaces of the insulation layers 31 to 34.

Each via 41V includes the via seed layer 71 and the filled portion 72. The via seed layer 71 is formed on the wall surface of the insulation layer 31 defining the corresponding via hole 31X. The filled portion 72 is rod-shaped (inverted truncated cone-shaped) in the via hole 31X, in which the via seed layer 71 is formed. The via seed layer 71 is formed from, for example, copper or a copper alloy.

The wiring pattern 41P includes the wiring seed layer 73 and the pattern layer 74. The wiring seed layer 73 is formed on the upper surface 31A of the insulation layer 31. The pattern layer 74 covers the upper surface of the wiring seed layer 73 and the upper surface of each via 41V. The wiring seed layer 73 is formed from, for example, nickel or a nickel alloy. The pattern layer 74 is formed from, for example, copper or a copper alloy.

The filled portions 72 and the pattern layer 74 are formed through electrolytic plating that uses the via seed layer 71 and the wiring seed layer 73 as the power feeding electrodes. The adsorption action of the plating enhancement agent 84 used in electrolytic plating is not affected by the wiring seed layer 73, which is formed from nickel or a nickel alloy, but is affected by the via seed layer 71, which is formed from copper or a copper alloy. Thus, when the via seed layer 71 and the wiring seed layer 73 are immersed in the solution containing the plating enhancement agent 84, the plating enhancement agent 84 is adsorbed only on the surface of the via seed layer 71. The plating enhancement agent 84 enhances formation (deposition) of a plating metal in each via hole 31X. Consequently, the via hole 31X is filled with the plating metal to form the filled portion 72. Further, the plating metal is deposited on the filled portion 72 and the wiring seed layer 73 to form the pattern layer 74. In this manner, the wiring pattern 41P is formed by the wiring seed layer 73 and the pattern layer 74. The thickness of the wiring pattern 41P is reduced as compared to a wiring pattern that is formed by performing electrolytic plating on a copper wiring seed layer. This allows for formation of the finer wiring pattern 41P.

(2) The metal film 81 is formed on the surface of the insulation layer 31 including the via holes 31X. After the metal film 81 (structure illustrated in FIG. 2C) is dried, soft etching is performed. The drying process lowers the wettability of the surface of the metal film 81. This hinders the etchant from entering the metal film 81 formed in the via holes 31X. This selectively removes the metal film 81 from the upper surface 31A of the insulation layer 31 (refer to FIG. 2D). Thus, the via seed layer 71 is easily formed in the via holes 31X.

(3) The catalyst 82 is adsorbed on the surface of the insulation layer 31 in which the via seed layer 71 is formed. Then, soft etching is performed on the via seed layer 71 (structure illustrated in FIG. 2E) to slightly remove the via seed layer 71. Consequently, the catalyst 82 remains only on the upper surface 31A of the insulation layer 31 (refer to FIG. 2F). Subsequently, electroless plating is performed using the catalyst 82 to form the wiring seed layer 73. The wiring seed layer 73 is formed from nickel. Thus, the wiring seed layer 73 is easily formed on the upper surface 31A of the insulation layer 31.

It should be apparent to those skilled in the art that the foregoing embodiments may be employed in many other specific forms without departing from the scope of this disclosure. Particularly, it should be understood that the foregoing embodiments may be employed in the following forms.

In the above embodiment, the wiring substrate 10 may be a coreless wiring substrate that does not include the core substrate 20. Such a coreless substrate may be obtained by forming the wiring portions 30, 50 on opposite surfaces of a support substrate and then separating the support substrate from the wiring portions 30, 50.

In the above embodiment, the wiring seed layer 73 is formed from nickel or a nickel alloy. Instead, the wiring seed layer 73 may be formed from another metal that does not or subtly act to adsorb the plating enhancement agent. Alternatively, the wiring seed layer 73 may be formed from a metal material that produces an adsorption effect acting on the plating enhancement agent that is much smaller than that produced by the via seed layer 71.

In the above embodiment, the wiring portions 30, 50 may include any number of insulation layers and any number of wiring layers.

CLAUSES

This disclosure also encompasses the following embodiments.

1. A method for manufacturing a wiring substrate, the method including:

forming a via hole in an insulation layer;

forming a via seed layer on a wall surface of the insulation layer that defines the via hole, wherein the via seed layer acts to adsorb a plating enhancement agent that enhances formation of a plating metal;

forming a wiring seed layer on an upper surface of the insulation layer, wherein the wiring seed layer does not act to adsorb the plating enhancement agent as compared to the via seed layer;

adsorbing the plating enhancement agent on a surface of the via seed layer; and forming a filled portion and a pattern layer by performing electrolytic plating with an electrolytic plating solution that does not contain the plating enhancement agent, wherein the forming a filled portion and a pattern layer includes forming the filled portion by filling the via hole, which includes the via seed layer, with the plating metal, and forming the pattern layer by depositing the plating metal on the filled portion and on the wiring seed layer.

2. The method according to clause 1, wherein the forming a via seed layer includes forming a metal film on an entire surface of the insulation layer including the via hole, drying the metal film by blowing air, and removing the metal film from the upper surface of the insulation layer through soft etching thereby forming the via seed layer.

3. The method according to clause 1 or 2, wherein the forming a wiring seed layer includes:

adsorbing a catalyst on a surface of the via seed layer, which is formed in the via hole, and the upper surface of the insulation layer;

removing the catalyst from the via hole by soft-etching the surface of the via seed layer with a copper etchant; and forming the wiring seed layer on the upper surface of the insulation layer, on which the catalyst is adsorbed, with an electroless plating solution.

4. The method according to any one of clauses 1 to 3, wherein the forming a filled portion and a pattern layer includes:

forming a resist layer on the wiring seed layer, wherein the resist layer includes an opening;

forming the filled portion and the pattern layer with the electrolytic plating solution using the resist layer as a plating mask;

removing the resist layer; and etching the wiring seed layer using the pattern layer as an etching mask to pattern the wiring seed layer into a desired shape.

5. The method according to any one of clauses 1 to 3, wherein the forming a filled portion and a pattern layer includes:

forming a resist layer on the pattern layer, which is formed on the filled portion and the wiring seed layer, wherein the resist layer includes an opening;

etching the pattern layer using the resist layer as an etching mask to pattern the pattern layer into a desired shape; and etching the wiring seed layer using the resist layer as the etching mask to pattern the wiring seed layer into a desired shape.

6. The method according to any one of clauses 1 to 5, wherein the plating enhancement agent is bis(3-sulfopropyl)disulfide, the via seed layer is formed from copper or a copper alloy, and the wiring seed layer is formed from nickel or a nickel alloy.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
 a first wiring layer;
 a first insulation layer covering the first wiring layer and including a via hole that exposes a portion of an upper surface of the first wiring layer; and
 a second wiring layer including a wiring pattern and a via, wherein the wiring pattern is formed on an upper surface of the first insulation layer, and the via is formed in the via hole to electrically connect the wiring pattern and the first wiring layer, wherein
  the via includes
   a via seed layer formed on a wall surface of the first insulation layer that defines the via hole, and
   a filled portion formed in the via hole in which the via seed layer is formed, wherein the via hole is filled with the filled portion,
  the wiring pattern includes
   a wiring seed layer formed on the upper surface of the first insulation layer, and
   a pattern layer formed on the wiring seed layer, wherein the pattern layer covers both of the wiring seed layer and the filled portion of the via,
  the via seed layer is formed from a metal material that acts to adsorb a plating enhancement agent which enhances formation of the filled portion and the pattern layer in an electrolytic plating solution, and
  the wiring seed layer is formed from a metal material that does not act to adsorb the plating enhancement agent as compared to the via seed layer.

2. The wiring substrate according to claim 1, wherein the via seed layer is formed from copper or a copper alloy, and
 the wiring seed layer is formed from nickel or a nickel alloy.

3. The wiring substrate according to claim 1, wherein the via seed layer resides only in the via hole.

* * * * *